INVENTORS:
COURTLAND M. HENDERSON
EMIL R. BEAVER Jr
BY LOUIS J. REITSMA Jr
Mary B. Moskier
ATTORNEY INVENTORS:
COURTLAND M. HENDERSON
EMIL R. BEAVER Jr
LOUIS J. REITSMA Jr
BY Mary B. Mosbier
ATTORNEY United States Patent Office 3,467,555

Patented Sept. 16, 1969

3,467,555

LEAD-TELLURIDE WITH CESIUM CHLORIDE AND SEGMENTED THERMOELECTRIC ELEMENTS

Courtland M. Henderson, Xenia, and Emil R. Beaver, Jr., Tipp City, Ohio, and Louis J. Reitsma, Jr., Nunica, Mich., assignors to Monsanto Research Corporation, St. Louis, Mo., a corporation of Delaware Filed Oct. 22, 1965, Ser. No. 500,997

Int. Cl. H01v *1/30*

U.S. Cl. 136—205 19 Claims

Figure 1:
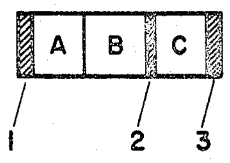

This invention relates to power generating devices and the like and more particularly relates to means of converting thermal energy into electrical energy in thermoelectric generators and similar devices. More specifically, the invention provides new and valuable thermoelements and thermoelectric power-generating devices in which the new thermoelements are used.

In accordance with the Seebeck effect, electromotive force is produced when one thermoelectric element is joined to a dissimilar thermoelectric element to form a circuit and their two junctions are maintained at different temperatures. This effect is utilized in thermoelectric generators, whereby electrical power is generated when heat is applied at one junction and rejected at the other.

In thermoelectric generators and other devices which are dependent on the Seebeck effect, one junction must be maintained at a temperature which is higher than that of another; hence, the two junctions are commonly referred to as either the hot junction or the cold junction. The efficacy of the device depends not only upon the nature of the thermoelement which is employed, but also upon the temperature difference of the two junctions. The greater such difference, the greater is the efficiency, irrespective of the composition of the thermoelements.

Much effort has been expended at preparing thermoelectric materials having a high Seebeck coefficient, low electrical resistivity and thermal conductivity in order to thus attain the highest possible figure of merit, and thereby there have been provided for this purpose many semiconducting materials. Some of them withstand very high temperatures, i.e., they are neither broken down nor oxidized when heated to temperatures of, say, 800° C. to 2000° C. As the temperature is increased at the hot junction there is a proportionate increase in the quantity of energy withdrawn from the thermoelements, so long as the temperature at their cold junctions is held constant. In order to obtain maximum efficiency, the Carnot efficiency factor $$\frac{T_2-T_1}{T_2}$$

where $T_2$ is the hot junction absolute temperature and $T_1$ is the cold junction absolute temperature, should be as high as possible.

A practical limitation is the effect of temperature on the thermoelectric properties of the thermoelectric material. In determining the efficacy of the material, there is used the following relationship, wherein Z is the figure of merit:

$$Z=\frac{S^2}{\rho K}$$

in which S is the Seebeck coefficient, $\rho$ is the electrical resistivity and K is the thermal conductivity. The higher the figure of merit, the better the efficacy. Electrical resistivity and thermal conductivity should thus be as low as possible and the Seebeck coefficient as high as possible. However, with many thermoelectric materials the figure of merit is a function of temperature. On the other hand, because the Carnot efficiency factor demands the greatest possible temperature difference, exposure of the thermoelement to variation in temperature is necessary. Accordingly, much effort has been expended at providing thermoelements having a substantially constant figure of merit over a broad temperature range. One way of attacking the problem has been to prepare segmented thermoelements, i.e., elements consisting of two or more thermoelectric materials. The materials are positioned in the thermoelement at sites where the temperatures to which they will be exposed will be those that favor the highest figure of merit.

If the figure of merit of the thermoelectric material decreases with increase in temperature, then such a material should, of course, be positioned at a point in the device where it is exposed only to the temperatures at which performance would be optimized. To provide an element suitable for operation at, say, 1200° C., a material should be used in proximity to the heat source which has a high figure of merit at 1200° C. At a more remote distance from the heat source, a second material which deteriorates at 1200° C., but which is stable at 800°–600° C. can be used, if at the latter temperature range it has a high or useful figure of merit. At an even more remote distance, another material which is stable at and has a high figure of merit at lower temperature, say, at 600° C. to 400° C., may make up a third segment of the thermoelement. The resulting element will thus consist of segments of three diverse thermoelectric materials positioned to give along the element a gradient in the temperature to figure of merit ratio of said materials.

Although the figure of merit and the Seebeck coefficient upon which it is dependent are helpful in determining the efficiency of a thermoelectric material, these factors do not suffice for accurate matching of thermoelectric materials in making segmented thermoelements. The greater the number of segments, the more unpredictable is the matching. Even though the electrical properties of a thermoelectric material are suitable at some range of temperatures for a segment of a thermoelectric leg at a certain position thereof, it may be entirely unsuitable for use with certain other segments.

This is particularly true when it is desired to operate at very high temperatures, e.g., at temperatures of above 1000° C. Since the great interest in operation at the very high temperatures is based on the possibility of attaining the high $\Delta t$ values required for attaining maximum Carnot efficiency, use of segmented thermoelements in this field is of special promise. In practice, however, in high temperature operation, use of as many as three segments often results in the production of less power output than when only one material is used. Accordingly, in spite of the fact that use of segments of diverse thermoelectric material presents an ideal means of obtaining a very high difference ($\Delta t$) in temperature between the hot and cold junctions of a thermoelectric leg, segmented thermoelectric legs have not been commonly employed in the high temperature thermoelectric art.

Accordingly, an object of the invention is the provision of an efficient triple segmented thermoelement for use as a leg of a thermoelectric module which is capable of operating at a hot end temperature of up to above 1000° C. Another object is the provision of an improved, triple-segmented p-type thermoelement. Still another object is the provision of an improved n-type thermoelement. A most important objective is the provision of an improved thermoelectric couple comprising triple-segmented p-type and n-type legs and adapted for use in electrical power generators operating at hot end temperatures above 1000° C.

These and other objects hereinafter described are met by the invention wherein there is provided a p-type thermoelement consisting essentially of the three thermoelectric segments: (A) a hot-end segment prepared by hot pressing a mixture consisting essentially by weight of from 79 to 81% of boron, 9 to 12% of carbon, 6 to 8% of a p-type dopant, and 1.0 to 2.5% of calcium oxide; (B) an intermediate segment prepared by hot pressing a mixture consisting by weight of from 51 to 53.5% of germanium, 46.0 to 48.5% of silicon, from 0.3% to 1.2% of calcium oxide and up to 1% of a p-type dopant; and (C) a cold-end segment prepared by hot pressing a mixture consisting essentially of lead telluride containing a p-type dopant and from 0.1% to 1.0% of cesium chloride, based on the total weight of the telluride plus dopant.

The above objectives are further met by provision of an n-type thermoelement consisting essentially of tthe segments: (D) a hot end segment prepared by hot pressing a mixture consisting essentially by weight of from 60 to 70% of silicon, from 23 to 29% of carbon, from 1 to 8% of thorium dioxide, from 0.0 to 3.0% of calcium oxide and from 0.5 to 7.0% of an n-type dopant; (E) an intermediate segment prepared by hot pressing a mixture consisting essentially by weight of from 48.0 to 50.5% of germanium, from 42 to 44.5% of silicon, from 1 to 3% of thorium dioxide and from 1% to 4.5% of an n-type dopant; and (F) a cold-end segment prepared by hot pressing a mixture consisting essentially of lead telluride containing an n-type dopant and from 0.1% to 1.0% of cesium chloride, based on the total weight of the telluride plus dopant.

Preferred ranges of constituents of the mixtures used for the above segments are as follows:

(A–1)

boron, 79–81%
carbon, 10–11%
calcium oxide, 1.5–2.0%
p-type dopant (e.g., boron) 6–8%

(B–1)

germanium, 52.0–53.0%
silicon, 46.75–47.25%
calcium oxide, 0.5–1.0%
p-type dopant (e.g., boron) 0.05 to 0.10%

(C–1)

lead telluride, 99.52–99.90%
p-type dopant (e.g., sodium) 0.0069% to 0.0686%
cesium chloride, 0.1 to 0.5%

(D–1)

silicon, 63–64%
carbon, 26.25–27.25%
thorium dioxide, 5.5–6.0%
calcium oxide, 1.3–1.5%
n-type dopant (e.g., cobalt), 1.3–1.6%

(E–1)

germanium, 49.0–49.5%
silicon, 44.2–44.4%
thorium dioxide, 2.5–3.5%
n-type dopant (e.g., arsenic), 3.2–3.5%

(F–1)

lead telluride, 99.0%–99.52%
cesium chloride, 0.1 to 0.5%
n-type dopant (e.g., lead iodide) 0.0138% to 0.138%

The calcium oxide, the cesium chloride and the thorium dioxide are dispersants and although they are present in only very small quantities, they strengthen the formed segments and modify their thermal and electrical conductivities, facilitating matching of the segments.

As is known to those skilled in the art, thermoelectric materials generally comprise a matrix containing a small amount, generally less than about 1% of one or more "dopants" or "promoters" to give n (negative) or p (positive) thermoelectric properties; see, for example, the book by William Shockley, "Electrons and Holes in Semiconductors," N.Y., D. Van Nostrand Co., particularly at pages 4–15. Commercial suppliers of thermoelectric materials frequently incorporate the dopant into the matrix and simply refer to the products as either of the p-type or of the n-type. Thus, the well-known thermoelectric, lead telluride, is supplied as p-type lead telluride when it contains a p-type dopant such as sodium and as an n-type lead telluride when it contains an n-type dopant such as lead iodide.

Very often when certain elements are mixed together, they form molecular compounds, particularly when hot pressing or other compacting techniques are used as in shaping of thermoelements. When an element is present in an excess over that required for a molecular compound with another constituent of the mixture, the excess may serve as dopant. In segment (A) of the presently provided p-type element, an excess of boron, over that required for formation of a molecular compound with carbon, serves to provide p-type property.

The segmented thermoelements are formed by hot pressing techniques, e.g., by loading a die with a first, highly heat-resistant thermoelectric material in finely divided form and pressing it at the temperature and pressure required for consolidation, allowing the resulting layer or segment of thermoelectric to cool and then pressing to it a layer of a second thermoelectric material under conditions which are sufficient to consolidate the second thermoelectric and bond it to first, but insufficient to affect the thermoelectric properties of the first segment. The two-segmented body thus obtained may then be used as the ram for hot pressing a third powdered thermoelectric material under conditions which cause it to consolidate and adhere to the ram for formation of the triple segmented element. The segments may or may not be separated by a barrier layer.

Advantageously, the segments of thermoelectric materials may be bonded to each other by means of a graphite inter-layer, i.e., by hot pressing the finely comminuted thermoelectric material to one surface of a graphite disc to form a layer or segment of the thermoelectric material firmly bonded to graphite, and then pressing a layer of another thermoelectric material to the opposite surface of the graphite to give a second segment of thermoelectric bonded to the graphite disc, substantially as disclosed in the Emil R. Beaver, Jr. et al. application U.S. Ser. No. 385–648, filed July 28, 1964. The third segment is likewise bonded to the others by means of segment interleafing graphite.

The segmented element may also be fabricated by first hot pressing individual segments of each different thermoelectric material and then fixing the segments to each other, e.g., by means of solders or cements, pins or screws. However, hot pressing of successive segments to each other is recommended and bonding through graphite, as described above, is preferred. This procedure provides a firmly bonded segment, since each of the thermoelectric materials which is employed for the diverse segments adhere well to graphite, and the graphite has substantially no effect on the resistivity of the thermoelectric materials.

The presently provided triple-segmented thermoelements may have graphite hot- and cold-ends bonded thereto by the hot pressing operation. However, for the end portions there may be employed other thermally and electrically conducting materials which will withstand the temperature conditions to which the element will be exposed during use in a thermoelectric device, e.g., a tantalum alloy may be used at the hot end and a copper alloy may be used at the cold end.

The invention is further illustrated by, but not limited to, the following examples.

Example 1

The following three, finely ground (200) formulations were respectively used for the preparation of a triple-segmented p-type thermoelement:

(A)

| | Wt., percent |
|---|---|
| Boron | 87.84 |
| Carbon | 10.43 |
| Calcium oxide | 1.73 |

(B)

| | |
|---|---|
| Germanium | 52.25 |
| Silicon | 47.05 |
| Calcium oxide | 0.672 |
| Boron | 0.065 |

(C)

| | |
|---|---|
| Lead telluride | [a] 99.53 |
| Cesium chloride | 0.47 |

[a] Containing 0.076% of sodium for p-type doping.

The excess of boron in (A), over that required for a molecular compound of boron with the carbon (boron carbide), served as p-type dopant. In (B) the boron was added to give p-type property. Calcium oxide served as dispersant in (A) and (B); this function was served by cesium chloride in (C).

A disc of graphite, denoted as element 1 in FIGURE 1 of the drawings, having a diameter of 0.375" and a thickness of 0.1" (this may range from 1/32" to 1/2") was inserted into the boron nitride liner of a die, the liner being dimensioned to receive the disc snugly. A 1.2 g. portion of (A) was then added to make an even layer on the top surface of the disc and hot pressed at a temperature of 2080° C. while pressure of up to 3000 p.s.i. was applied. There was thus obtained a 0.61 cm. layer of (A) firmly bonded to graphite. It was reinserted into the die-liner and 2.3 g. of (B) was added on the exposed top surface of the pressed (A). On top of the layer of (B) there was placed the graphite disc 2 to serve as ram. Hot pressing of (B) was conducted at up to 1345° C. while increasing the pressure to 1000 p.s.i. There was thus obtained a 1.5 cm. layer of (B) which was firmly bonded to (A) at one surface and to the graphite at the opposite surface. The compact thus obtained, using the graphite adjacent to (A) as the hot end junction and the graphite portion adjacent to (B) as the cold end junction, was tested for use as p-type leg of a thermocouple, employing a hot end temperature of 1200° C. It was found to give a $\Delta t$ value of 674° C. and to produce a voltage of 122.76 millivolts, with its cold end radiatively cooled in a vacuum environment. The graphite adjacent to the layer (B) was then cut off to leave only a very thin surface of graphite on the surface of (B). After cross-hatching this residual graphite, the compact was used as a ram for hot pressing 4.0212 g. of the formulation (C) using a boron-nitride liner of the same size as that used for making the compact and having the end graphite disc 3 at the bottom to serve as cold end. The cross-hatched end of the compact was pressed against formulation (C) at up to 850° C. while the pressure was increased to 1000 p.s.i., and then held for 5 minutes. There was thus obtained a 0.7 cm. layer of (C) bonded to (B) through the interleafing layer of graphite.

FIGURE 1 of the drawings is a cross-sectional view of the thermoelement thus obtained. The graphite end adjacent to the layer of (A) was used as the hot junction end and was heated to 1000° C., in testing the compact of $(A)+(B)+(C)$ as the p-type leg of a thermoelement. It was thus found to give a $\Delta t$ value of 782° C. and to produce a voltage of 169.5 millivolts and 0.104 watt of power when its cold end was cooled radiatively in a vacuum environment. Higher $\Delta t$ values are attainable if convective or conductive cooling is used.

Example 2

Figure 2:
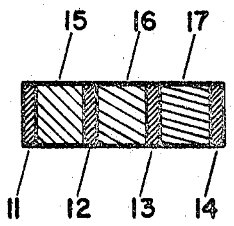

This example is like Example 1, except that a disc of graphite was used as the intermediate material in the bonding of each of the thermoelectric materials to each other. FIGURE 2 of the drawings illustrates the thermoelement thus obtained. A hot-end graphite disc 11 having a thickness of about 0.10" and a diameter of 0.375" was placed in the bottom of the die-liner, and 1.2 g. of formulation (A) was placed in a layer on top of the bottom disc. The layer 15 of (A) was then covered with the graphite disc 12 of substantially the same size as the first and the whole was pressed at a temperature of up to 2020° C., while increasing the pressure to 4000° p.s.i. There was thus obtained the compacted layer 15 of (A) having the hot-end graphite plug 11 bonded to one surface and the graphite disc 12 bonded to the other. The layer of (A) had a thickness (element length) of 0.280". The compact was reinserted into the die-liner, with the plug end 11 down, and 2.3 g. of formulation (B) was placed on top of graphite disc 12 of the compact. The resulting layer 16 of (B) was covered with the 0.1" thick graphite disc 13 and hot pressing in the die was conducted at a temperature of up to 1338° C. while raising the pressure to 1000 p.s.i. There was thus obtained a 0.370" thick layer of (B), firmly bonded between the graphite and making up a unit consisting of the graphite hot end plug 11, the layer 15 of (A), graphite disc 12, the layer 16 of (B), and graphite disc 13. The unit was tested as the p-leg of a thermocouple, at a hot-end temperature of 1000° C. A voltage of 55 millivolts, a current of 1.900 amperes and power of 0.1045 watt was obtained when this unit was subjected to a $\Delta t$ of 552° C. The unit was then employed as the male ram for hot pressing formulation (C), using the graphite disc 13 as the abutting surface. This was done by cross-hatching the exposed upper surface of disc 13, inserting the graphite end plug 14 into a die-liner (0.375" ID), placing on the exposed surface of the plug a layer of (C), consisting of 3.9762 g. of the doped lead telluride and 0.0238 g. of cesium chloride, and ramming the cross-hatched surface of disc 13 against the layer (C) while heating to 850° C. and pressing to 2000 p.s.i. There was thus obtained the 0.28" layer 17 of (C), firmly bonded between the cross-hatched surface of graphite disc 13 and the graphite end plug 14. The entire body, consisting successively of hot end graphite plug 11, the layer 15 of (A), the graphite disc 12, the layer 16 of (B), graphite disc 13, the layer 17 of (C) and graphite cold end plug 14 was tested as a triple-segmented p-type element in a thermocouple at a hot end temperature of 1024.5° C. There was obtained a $\Delta t$ value of 722.7 and a power output of 0.176 watt. Measurement of the temperature along the element showed that the $\Delta t$ value of the (A) segment 15 was 189° C., that of the (B) segment 16 was 244° C., and that of the (C) segment 17 was 290.2° C.

Example 3

The procedure of Example 2 was repeated, except that there were employed sufficient quantities of (A), (B) and (C) to produce a hot pressed three-segmented element wherein the length of the segment of (A) was 1.22 cm.; that of the segment of (B) was 1.15 cm. and the length of the segment of (C) was 0.73 cm.

The open circuit voltages $E_{oc}$ for each segment were 0.0310 volt for (A), 0.0314 volt for (B), and 0.0590 volt for (C). The resistance R of each segment was 0.0027 ohms for (A), 0.0028 ohms for (B), and 0.0052 ohms for (C).

Use of the segmented thermoelement as a p-type leg of a thermocouple at a hot end temperature of 1200° C. and a cold end temperature of 380° C. (over-all $\Delta t$ of 820° C.) gave a power output of 0.346 watt.

Example 4

The following three, finely comminuted formulations were respectively used for the preparation of an n-type thermoelement.

(D)

| | Wt., percent |
|---|---|
| Silicon | 64.60 |
| Carbon | 26.75 |
| Thorium dioxide | 5.78 |
| Cobalt | 1.47 |
| Calcium oxide | 1.40 |

(E)

| | |
|---|---|
| Germanium | 49.2 |
| Silicon | 44.3 |
| Arsenic | 3.38 |
| Thorium dioxide | 2.98 |

(F)

| | |
|---|---|
| Lead telluride | [a] 99.51 |
| Cesium chloride | 0.49 |

[a] Containing 0.06% of lead iodide as n-type dopant.

In (D) cobalt serves as an n-type dopant; the calcium oxide and the thorium dioxide are dispersants. In (E), the n-type dopant is arsenic and the thorium dioxide serves as a dispersant. In (F), cesium chloride is the dispersant.

FIGURE 2 of the drawings illustrates the thermoelement prepared from the above formulations.

A graphite end plug 11 was placed snugly into an 0.375" ID boron nitride liner and the exposed surface of the plug was covered with the layer 15 of 2.0 g. of formulation (D). A 0.1" thick graphite disc 12 was placed in the die liner to cover the entire upper surface of (D). The liner and its contents were then heated in a die to 2045° C. while exerting a mechanical pressure of up to 4000 p.s.i. on the heated formulation. After cooling, 2.3 g. of formulation (E) was placed on the top surface of disc 12 and the top surface of the resulting layer 16 of (E) was covered by the 0.1" thick graphite disc 13. Hot pressing at up to 1345° C. while increasing the pressure to about 1500 p.s.i. gave a well bonded unit consisting of the graphite end plug 11, the 0.375" layer 15 of (D), the 0.1" thick graphite disc 12, the 0.375" layer 16 of (E), and the graphite disc 13. Measurement of the electrical properties of each of segment 15 (D) and segment 16 (E) at a hot-junction temperature of 1200° C. gave the following values:

| | Seebeck coefficient, $\mu v/°$ C. | Δt. ° C. | Resistance, ohms |
|---|---|---|---|
| Segment: | | | |
| (D) | −127 | 390 | 0.0035 |
| (E) | −290 | 300 | 0.0078 |

The open circuit voltage was 0.038 volt for (D) and 0.087 volt for (E).

The two segmented units of (D) and (E), consisting of disc 11, layer 15 (D), disc 12, layer 16 (E) and disc 13, were used as a ram for hot pressing the formulation (F). A die-liner of the same dimension as above was charged first with the graphite plug 14 (to be used as the cold end plug) and then with formulation (F), consisting of 4.0023 g. of lead tellurium and 0.0198 g. of cesium chloride. The exposed upper surface of the disc 13 which was bonded to layer 16 (E), was pressed against the charge of (F) at up to 2000 p.s.i. and up to 860° C. Upon cooling there was obtained an element consisting successively of the hot end graphite plug 11, the layer 15 of (D), the 0.1" graphite disk 12, the layer 16 of (E), the 0.1" graphite disc 13, the approximately 0.3" layer 16 of (F) and finally the cold end plug 14. The open circuit voltage of the segment 16 of (F) was 0.068 volt and the resistance was 0.0058 ohm. When used as the n-type element of a thermocouple, heating at 1189.5° C. at the hot end graphite plug adjacent to (D) and cooling to 355° C. at the cold end graphite plug adjacent to (F) ($\Delta t$, 834° C.) gave 0.551 watt of power.

Example 5

Figure 3:
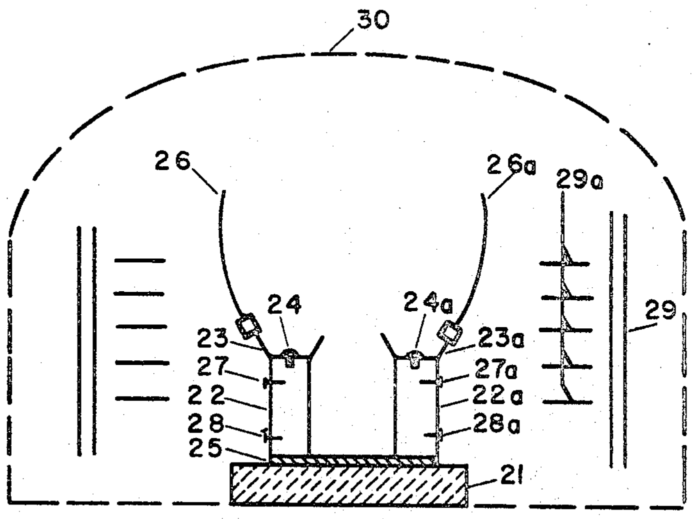

The thermoelements of Example 2 and Example 4 were used in the thermocouple depicted in FIGURE 3 of the drawings wherein element 21 is a uniformly heated graphite base, element 22 is the p-type element of Example 2 through which heat is conducted to the copper, wing-shaped radiator 23 fixed to element 22 by means of metallic screw 24, element **22*a* is the n-type thermoelement of Example 4 which is joined at its hot end to the hot end of element 22 by means of a molybdenum strap 25, element 23*a* is a radiator of the same construction as radiator 23 and connected by means of screw 24*a* to element 22*a*, elements 26 and 26*a* are electrical leads used to conduct the generated power to an approximately matched resistive load (not shown), element 27 and 27*a* are thermocouples for measuring the hot end temperature and elements 29 and 29*a* are insulating shields used to minimize the amount of heat from the heated base 21 to the sides of housing 30. Subjecting the hot-ends of elements 22 and 22*a* to a temperature of about 1200° C. in a vacuum environment while cooling housing 30** gives $\Delta t$ values in the order of from 1000° C. to 1100° C. with consequent production of a magnitude of electrical power which is unattainable in absence of a thermoelement which does not permit the use of thermoelectric materials at temperatures where they demonstrate their peak of performance while simultaneously providing for a maximum difference between the hot and cold-end temperatures.

Example 6

Figure 4:
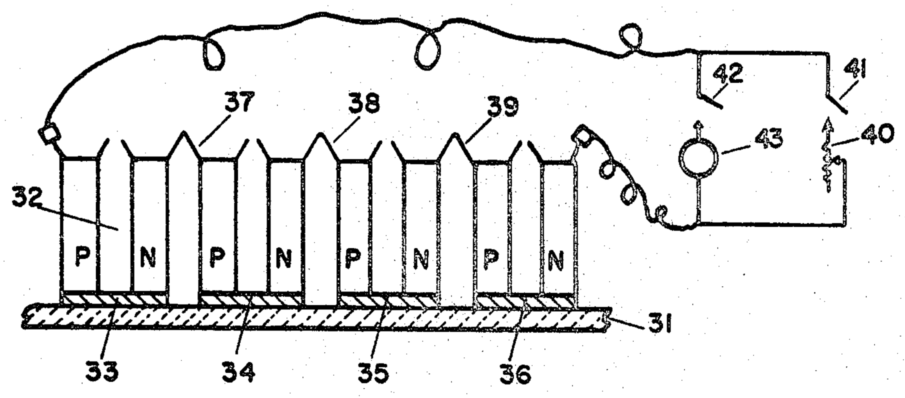

In another embodiment of the invention, p-type and n-type thermoelements, made as in Examples 2 and 4, are assembled to give either a power generator or a cooling device, as shown in FIGURE 4. Element 31 represents an electrical insulating but thermally conducting hot wall of a nuclear or chemical reactor, exhaust manifold, pipe or other unit which it is desirable to cool or from which heat can be absorbed for the purpose of converting to electricity. Element 32 represents an air or vacuum gap or electrically and thermally insulating material between each p-n thermoelement or leg. Elements 33, 34, 35 and 36 represent individual hot junction straps between each p-n combination. Elements 37, 38 and 39 represent individual cold junctions between each n-p combination. Said junctions comprise a strap or sheet of electrically and thermally conducting metal, e.g., graphite or molybdenum at the hot-ends, and copper or beryllium at the cold-ends. These straps are fixed to each of the two members of the p-n combination by a thermally and electrically conductive adhesive or screw. The cold junctions are outwardly finned between each of the n-p combinations; thus elements 37, 38 and 39 serve both as electrical conductors and as radiators, heat being removed from said elements by radiation cooling. When the unit is to serve as energy converter, load 40 is connected through switch 41 with switch 42 open. To generate electricity, a heat source is directed at element 31, through which the heat flows to the individual hot junctions 33, 34, 35 and 36, then through each p and n leg and thence through cold junctions 37, 38 and 39. Thermal energy is converted to electrical energy when the thermal energy flows through the p and n legs of the device. This electrical energy can then be used to operate load 40.

When the unit is to be used as a cooling device, switch 41 is opened and switch 42 is closed, connecting the unit in series with a power source 43 which causes current to flow in a reverse direction to that of the flow when the unit produces electric power. By reversing the direction of current used for cooling, the unit will supply heat at the previously cool part of the device and cooling at the previously hot-end of the device. Thus, the device can be used for heating or cooling, depending on the direction of current flow from power source 43.

Thermoelectric devices of the type shown in FIGURE 4 are particularly useful for generating power when such a device is installed as a part of the exhaust system of autos, planes, boats, rockets and other systems where waste heat in excess of, say, 400° C. is available.

In the design of thermoelectric devices, it is especially important to have available thermoelectric units capable of operation providing for a large difference between the hot-end temperature and the cold-end temperature while not affecting mechanical strength and electron flow. Availability of the present thermoelements permits the design and fabrication of thermoelectric cooling and heating devices and power generating units with higher watt per pound ratios than is possible when conventional elements are used.

Thermoelements consisting of the formulations herein employed are also useful in wafer form, particularly in the fabrication of solar cells wherein surface areas for collection of radiant energy are complemented by surface areas of emittance.

The presently provided thermoelements are useful in thermoelectric devices generally, e.g., in power generators, cooling units, and in all devices where a power generating assembly requires heat rejection or absorption. Hence, the above examples and accompanying drawings are intended by way of illustration only. It will be obvious to those skilled in the art that many variations are possible within the spirit of the invention, which is limited only by the appended claims.

We claim:

1. A p-type thermoelement consisting essentially of the three thermoelectric segments: (A) a hot-end segment prepared by hot pressing a mixture consisting essentially by weight of from 79 to 81% of boron, 9 to 12% of carbon, 6 to 8% of a p-type dopant, and 1.0 to 2.5% of calcium dioxide; (B) an intermediate segment prepared by hot pressing a mixture consisting by weight of from 51 to 53.5% of germanium, 46.0 to 48.5% of silicon, from 0.3% to 1.2% of calcium oxide and up to 1% of a p-type dopant; and (C) a cold-end segment prepared by hot pressing a mixture consisting essentially of lead telluride containing a p-type dopant and from 0.1% to 1.0% of cesium chloride, based on the total weight of the telluride plus dopant.

2. The thermoelement defined in claim 1, further limited in that the dopant in (A) is boron present in (A) in a quantity which is in excess over that required for a molecular compound of boron with carbon.

3. The thermoelement defined in claim 1, further limited in that the dopant in (B) is boron.

4. The thermoelement defined in claim 1, further limited in that the dopant in (C) is sodium.

5. The thermoelement defined in claim 1, further limited in that segment (A) is bonded to segment (B) through an interleafing layer of graphite and segment (B) is bonded to segment (C) by another layer of interleafing graphite.

6. The thermoelement defined in claim 1, further limited in that the hot junction adjacent the hot-end segment (A) and the cold junction adjacent the cold-end segment (C) are of graphite, segment (A) is separated from segment (B) by a layer of graphite, and segment (B) is separated from segment (C) by a layer of graphite.

7. An n-type thermoelement consisting essentially of the segments: (D) a hot-end segment prepared by hot pressing a mixture consisting essentially by weight of from 60% to 70% of silicon, from 23 to 29% of carbon, from 1 to 8% of thorium dioxide, from 0.0 to 3.0% of calcium oxide and from 0.5 to 7.0% of an n-type dopant: (E) an intermediate segment prepared by hot pressing a mixture consisting essentially by weight of from 48.0 to 50.5% of germanium, from 42 to 44.5% of silicon, from 1 to 3% of thorium dioxide and from 1% to 4.5% of a n-type dopant; and (F) a cold-end segment prepared by hot pressing a mixture consisting essentially of lead telluride containing an n-type dopant and from 0.1% to 1.0% of cesium chloride based on the total weight of telluride plus dopant.

8. The thermoelement defined in claim 7, further limited in that the dopant in (D) is cobalt.

9. The thermoelement defined in claim 7, further limited in that the dopant in (E) is arsenic.

10. The thermoelement in claim 7, further limited in that the dopant in (F) is lead iodide.

11. The thermoelement defined in claim 7, further limited in that segment (D) is bonded to segment (E) through an interleafing layer of graphite, and segment (E) is bonded to segment (F) by another layer of interleafing graphite.

12. The thermoelement defined in claim 7, further limited in that the hot junction adjacent the hot-end segment (E) and the cold junction adjacent the cold-end segment (F) are graphite, (D) is separated from segment (E) by a layer of graphite, and segment (E) is separated from segment (F) by a layer of graphite.

13. A thermocouple containing as the p-type leg the thermoelement defined in claim 1.

14. A thermocouple containing as the n-type leg the thermoelement defined in claim 7.

15. A thermoelectric device comprising the thermoelement defined in claim 1.

16. A thermoelectric device comprising the thermoelement of claim 7.

17. A thermoelectric generator comprising the thermoelement defined in claim 1 and the thermoelement defined in claim 7.

18. A thermoelectric composition consisting essentially of p-type doped lead telluride and from 0.1% to 0.5% of cesium chloride based on the weight of the doped lead telluride.

19. A thermoelectric composition consisting essentially of n-type doped lead telluride and from 0.1% to 0.5% of cesium chloride.

References Cited

UNITED STATES PATENTS

| | | | |
|---|---|---|---|
| 2,811,571 | 10/1957 | Fritts et al. | 75—166 A XR |
| 3,285,019 | 11/1966 | Henderson et al. | 136—236 XR |
| 3,051,767 | 8/1962 | Fredrick et al. | 136—236 XR |

WINSTON A. DOUGLAS, Primary Examiner

DONALD L. WALTON, Assistant Examiner

U.S. Cl. X.R.

62—3; 136—238; 252—62.3

UNITED STATES PATENT OFFICE

CERTIFICATE OF CORRECTION

Patent No. 3,467,555 Dated September 16, 1969

Inventor(s) Courtland M. Henderson, Emil R. Beavers, Jr. and Louis J. Reit

It is certified that error appears in the above-identified patent and that said Letters Patent are hereby corrected as shown below:

Column 9, claim 1, line 38, "dioxide" should be --- oxide ---.

Signed and sealed this 12th day of June 1973.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69